United States Patent [19]
McNicol et al.

[11] Patent Number: 5,193,224
[45] Date of Patent: Mar. 9, 1993

[54] ADAPTIVE PHASE CONTROL FOR A POWER AMPLIFIER PREDISTORTER

[75] Inventors: John D. McNicol, Ottawa; Stephen G. Harman, Nepean, both of Canada

[73] Assignee: Northern Telecom Limited, Montreal, Canada

[21] Appl. No.: 690,432

[22] Filed: Apr. 24, 1991

[51] Int. Cl.$^5$ .......................... H03F 1/26; H04B 15/00
[52] U.S. Cl. .................................. 455/126; 455/50.1; 455/63; 330/149
[58] Field of Search .................. 455/126, 50.1, 63, 75, 455/119, 113; 375/60; 330/149

[56] References Cited

U.S. PATENT DOCUMENTS

| 4,929,906 | 5/1990 | Voyce et al. | 330/149 |
| 5,075,635 | 12/1991 | Boulanger et al. | 330/149 |

FOREIGN PATENT DOCUMENTS 1208709  7/1986  Canada .

OTHER PUBLICATIONS

"Amplifier Linearization Using a Digital Predistorter with Fast Adaptation and Low Memory Requirements", J. K. Cavers, *IEEE Transactions on Vehicular Technology*, vol. 39, No. 4, Nov. 1990, pp. 374–382.

*Primary Examiner*—Reinhard J. Eisenzopf
*Assistant Examiner*—P. Sobutka
*Attorney, Agent, or Firm*—R. John Haley

[57] ABSTRACT

In a QAM microwave radio communications system an IF (intermediate frequency) input signal is amplified and predistorted, and the amplified IF signal is mixed with a local oscillator signal to produce an RF (radio frequency) signal which is amplified in a power amplifier for transmission, the predistortion compensating for non-linearity of the power amplifier. Adaptive phase control of the predistorter is provided by mixing the local oscillator signal with part of the RF signal to produce an IF output signal representative of the output of the power amplifier, detecting phase differences between the IF input and IF output signals to produce a phase difference signal, selectively inverting the phase difference signal in dependence upon whether or not an IF signal amplitude exceeds a comparison level, and integrating the selectively inverted phase difference signal to produce a phase control signal for the predistorter.

8 Claims, 4 Drawing Sheets

ADAPTIVE PHASE CONTROL FOR A POWER AMPLIFIER PREDISTORTER

This invention relates to a method of adaptively controlling a predistorter to compensate for phase distortion in a power amplifier of an RF (radio frequency) communications system, such as is used in a transmitter of a microwave radio communications system, and to a transmitter for such a system.

BACKGROUND OF THE INVENTION

In a microwave radio communications system for example using QAM (quadrature amplitude modulation), it is well known to mix an IF (intermediate frequency) signal with an LO (local oscillator) signal at a microwave carrier frequency to produce an RF signal which is amplified in a power amplifier and transmitted. As is also well known, such a power amplifier generally has a non-linear transfer characteristic. In order to accommodate such a transfer characteristic it is known, for example from Putz U.S. Pat. No. 3,755,754 issued Aug. 28, 1973 and entitled "Predistortion Compensation for a Microwave Amplifier", to predistort the input to the power amplifier to compensate for the non-linearity.

The power amplifier non-linearity applies not only to the gain characteristic of the amplifier, but also to the signal phase, resulting in what is referred to as AM/PM (amplitude modulation to phase modulation conversion) distortion. This occurs in that signals passing through the power amplifier are subject to a phase change which is nonlinearly dependent upon the signal amplitude, so that an amplitude modulation of the input signal to the amplifier results in an amplified signal in which there is a phase modulation as well as an amplitude modulation.

It is known to adjust the phase characteristics of the predistorter manually in order to compensate as accurately as possible for the phase distortion of the power amplifier. However, such manual adjustment is undesirable, and can not conveniently accommodate changes, for example over time and with varying temperature, in the power amplifier characteristics. Accordingly, it is desirable to provide an adaptive control of the phase characteristics of the predistorter.

Such an adaptive control can be provided in a data directed manner by reverse signalling feedback from a receiver of the microwave radio communications system to control the transmitter phase. However, such reverse signalling feedback procedures fail to operate when the communications eye-pattern is closed, as typically occurs during signal fading. In order to avoid this problem it would be conceivable, but unduly expensive and hence commercially impractical, to provide a complete demodulator at the transmitter for adaptive control purposes.

An object of this invention, therefore, is to provide an improved method of adaptively controlling a predistorter to compensate for phase distortion in a power amplifier of an RF (radio frequency) communications system.

SUMMARY OF THE INVENTION

According to this invention there is provided a method of adaptively controlling a predistorter to compensate for phase distortion in a power amplifier of an RF (radio frequency) communications system in which an IF (intermediate frequency) input signal is mixed with a local oscillator signal to produce an RF signal for transmission, comprising the steps of: deriving from the local oscillator signal and the RF signal an IF output signal representative of the output of the power amplifier; detecting phase differences between the IF input and IF output signals to produce a phase difference signal; selectively inverting the phase difference signal in dependence upon whether or not an IF signal amplitude exceeds a comparison level; and integrating the selectively inverted phase difference signal to produce a phase control signal for the predistorter.

Preferably the method includes the steps of chopping the IF input and IF output signals, alternately squaring the chopped signals to remove phase information, and alternately comparing the chopped and squared signals with the comparison level to control the selective inversion of the phase difference signal.

The method preferably also includes the step of storing the phase control signal.

The invention also provides a transmitter for an RF (radio frequency) communications system, comprising: means for amplifying an IF (intermediate frequency) input signal; a predistorter for predistorting the IF signal; a first mixer for mixing a local oscillator signal with the amplified and predistorted IF signal to produce an RF signal; a power amplifier for amplifying the RF signal for transmission; a second mixer for mixing the local oscillator signal with a part of the amplified RF signal to produce an IF output signal; means responsive to the IF input signal and to the IF output signal for producing a phase difference signal representing phase differences between the IF input signal and the IF output signal; means for selectively inverting the phase difference signal in dependence upon whether or not an IF signal amplitude exceeds a predetermined comparison level; means for integrating the selectively inverted phase difference signal to produce a phase control signal; and means for controlling the predistorter with the phase control signal.

BRIEF DESCRIPTION OF THE DRAWINGS

The invention will be further understood from the following description with reference to the accompanying drawings, in which similar references are used in different figures to denote similar components and in which.

DESCRIPTION OF THE PREFERRED EMBODIMENT

Figure 1:
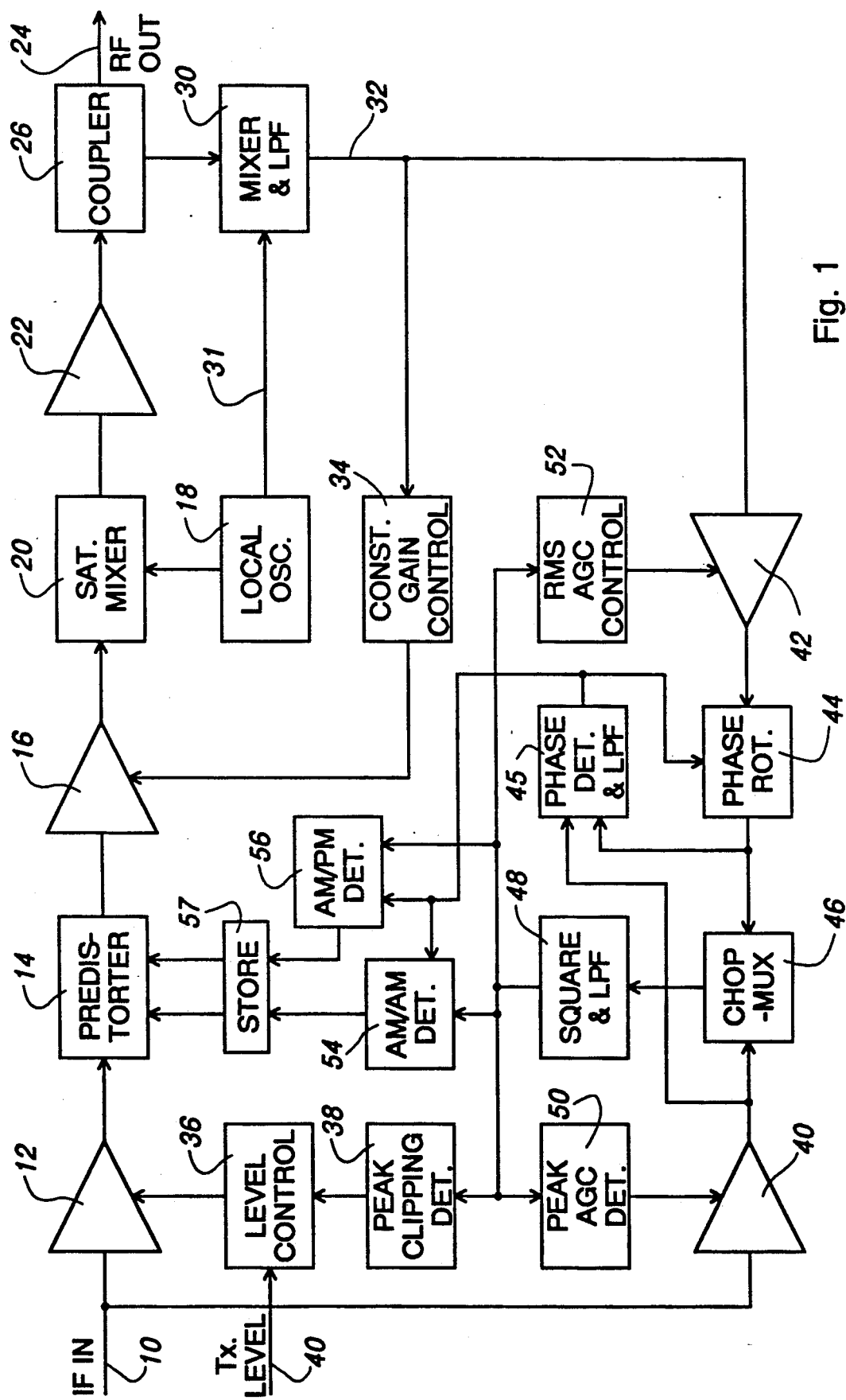
FIG. 1 is a block diagram illustrating parts of a transmitter of a microwave radio communications system in accordance with this invention.

Referring to FIG. 1, parts of a transmitter of a 512-QAM microwave radio communications system are illustrated. An IF (intermediate frequency, e.g. 140 MHz) input signal IF IN including phase quadrature signal components is supplied via a line 10 to a first IF AGC (automatic gain control) amplifier 12, whose output is coupled via a predistorter 14 to a second IF AGC amplifier 16. A local oscillator 18 includes a microwave frequency generator which produces a carrier signal at a microwave frequency of for example 4 GHz, with which the output of the amplifier 16 is mixed in a saturated image reject mixer 20. The mixer 20 can be operated and controlled as described and claimed in S. G. Harman U.S. patent application Ser. No. 7/524,904 filed May 18, 1990 and entitled "Frequency Converter for a Radio Communications System".

The output of the mixer 20 is a single sideband signal which is amplified in a solid state microwave RF (radio frequency) power amplifier 22 and transmitted as an RF output signal RF OUT via a line 24, a small portion of the RF signal being tapped off by a coupler 26. A mixer and LPF (low pass filter) 30 mixes this tapped-off part of the RF signal with a carrier signal component, supplied from the oscillator 18 via a line 31, to produce a coherent IF signal, and low pass filters this to produce an IF signal on a line 32. This IF signal on the line 32 is representative of the RF output signal and accordingly is referred to as an IF output signal. This IF output signal is fed back to a constant gain control circuit 34 which controls the gain of the second IF AGC amplifier 16 to provide a constant signal gain from the output of the predistorter 14 to the RF output line 24, this constant signal gain facilitating the design and implementation of the predistorter 14. In practice, the power amplifier 22 may be switched to provide various levels of gain for different microwave fading conditions, the constant gain control circuit 34 and the predistorter 14 being correspondingly switched. However, such switching is not essential to this invention and accordingly is not described further here.

In the absence of an over-riding control signal from a peak clipping detector 38, a level control circuit 36 serves to control the gain of the first IF AGC amplifier 12 in dependence upon a transmit level control signal (Tx. LEVEL) supplied via a line 40. This transmit level control signal is supplied in known manner via a reverse channel from a remote receiver to which the RF output signal on the line 24 is transmitted. In normal operation, when the signal level received by the receiver falls the level control circuit 36 is controlled, via the reverse channel and the transmit level control signal on the line 40, to increase the gain of the first IF AGC amplifier 12, thereby increasing the amplitude of the IF signal supplied to the predistorter 14. In view of the constant gain control provided for the second IF AGC amplifier 16 as described above, and the fact that the mixer 20 is a saturated mixer (i.e. the local oscillator signal supplied to the mixer has a much greater amplitude than the IF signal), the RF output signal level is therefore increased to compensate for the lowered receive signal level.

The peak clipping detector 38 serves to detect the onset of signal clipping by the power amplifier 22 and, in response to such detection, to prevent the level control circuit 36 from further increasing the gain of the first IF AGC amplifier 12, whereby clipping is curtailed. The peak clipping detector is described and claimed in McNicol et al. U.S. Pat. application No. 07/607,385 filed Oct. 31, 1990 and entitled "Controlling Clipping in a Microwave Power Amplifier", the entire disclosure of which is hereby incorporated herein by reference.

The IF signals on the lines 10 and 32 are amplified to similar levels by AGC amplifiers 40 and 42 respectively, and the output of the amplifier 42 is phase resolved by a phase rotator 44. The output of the amplifier 40 and the output of the phase rotator 44 are supplied to the inputs of a phase detector and LPF (low pass filter) circuit 45, whose output controls the phase rotator 44. The outputs of the amplifier 40 and the phase rotator 44 are also supplied to inputs of a chopper-multiplexer (chop-mux) circuit 46, where they are chopped and alternately supplied to a squaring and LPF circuit 48. The output of the circuit 48 is supplied to the peak clipping detector 38, to a peak AGC detector 50 which controls the gain of the amplifier 40, and to an RMS AGC control circuit 52 which controls the gain of the amplifier 42.

The outputs of the circuits 45 and 48 are also each supplied to two detectors 54 and 56 which serve for controlling the predistorter 14 via a store 57 as more fully described below. The detector 54 is an amplitude distortion, or AM/AM (amplitude modulation to amplitude modulation distortion), detector of well known form whose output controls amplitude predistortion in the predistorter 14. The detector 56 is an AM/PM (amplitude modulation to phase modulation distortion), detector which is described below and whose output controls phase predistortion in the predistorter 14 in accordance with this invention.

Figure 2:
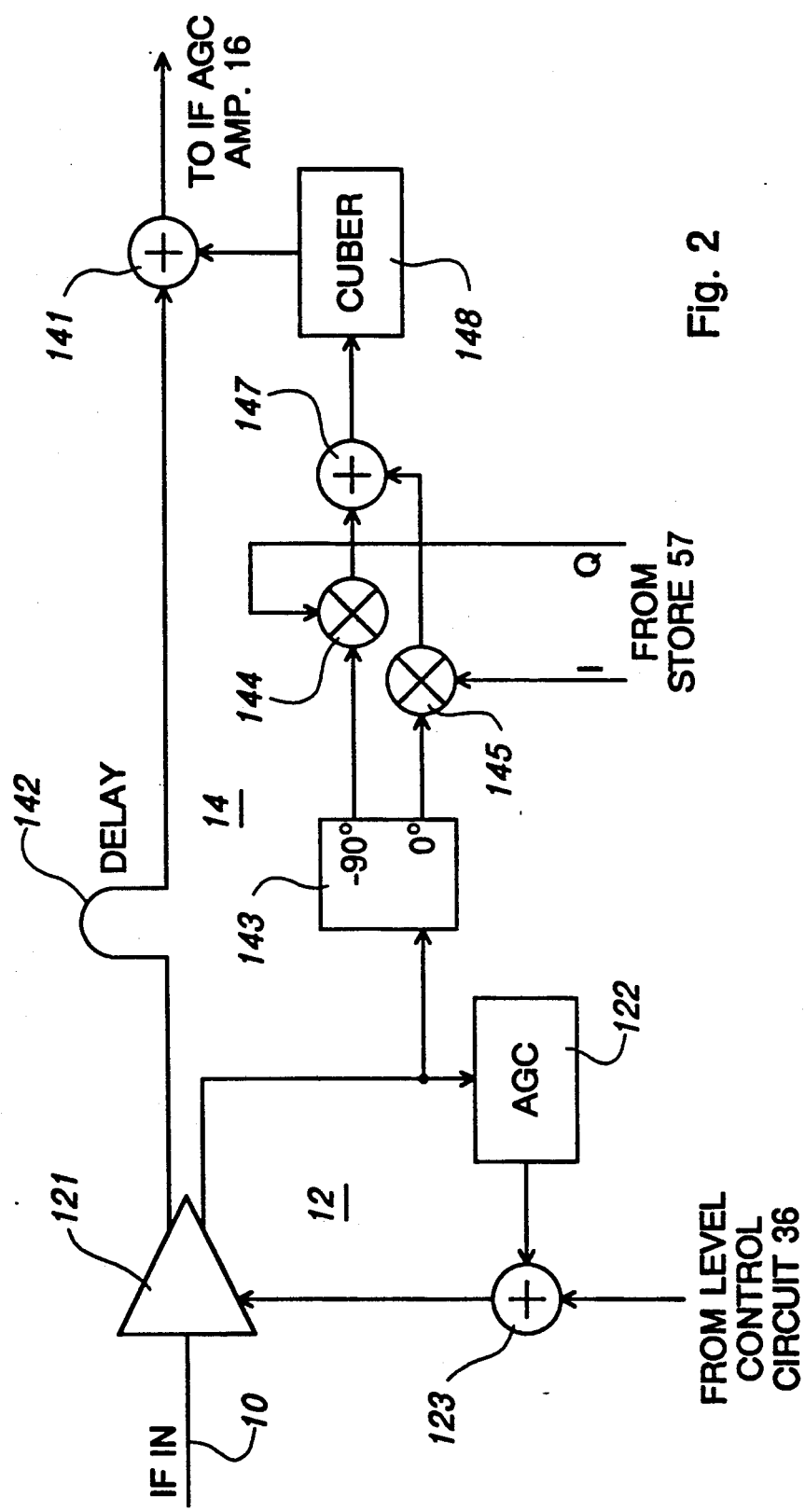
FIG. 2 is a block diagram illustrating in greater detail an intermediate frequency (IF) amplifier and predistortion circuitry of the transmitter of FIG. 1.

FIG. 2 illustrates in greater detail the first IF AGC amplifier 12 and the predistorter 14. The IF AGC amplifier 12 comprises an amplifier 121 having complementary outputs, and an AGC circuit 122 and an adder 123 in a gain control loop for controlling the gain of the amplifier 121. The adder adds to the output of the AGC circuit 122 an additional gain control signal from the output of the level control circuit 36, so that the gain of the first IF AGC amplifier 12 is controlled by the level control circuit.

The predistorter 14 comprises an adder 141 whose output is supplied to the input of the second IF AGC amplifier 16. One output of the amplifier 121 is coupled to an input of the adder 141 via a compensating delay 142, which can consist of a length of cable, and the other output of the amplifier 121 is coupled via a compensation path to another input of the adder 141. The compensation path includes a coupler 143 having phase quadrature (0° and −90°) outputs, multipliers (which can comprise mixers) 144 and 145, an adder 147, and a signal cuber 148. The phase quadrature output signals of the coupler 143 are multiplied in the multipliers 144 and 145 by respective in-phase and quadrature-phase control signals I and Q respectively. The control signal I is constituted in well known manner by the amplitude predistortion control signal output of the AM/AM detector 54, which is stored in the store 57 as described below. Similarly, the control signal Q is constituted by the phase predistortion control signal output of the AM/PM detector 56 produced as described below and also stored in the store 57.

The outputs of the multipliers 144 and 145 are summed by the adder 147, whose output is cubed by the signal cuber 148 (because the power amplifier 22 has a generally cubic characteristic) to produce a desired compensation signal. The adder 141 adds this compensation signal to the direct path signal to produce the predistorted IF signal which is supplied to the second IF AGC amplifier 16.

In order to facilitate proper operation of the detectors 38, 54, and 56, equality of the RMS levels of the IF input and output signals on the lines 10 and 32 is established by means of a chopper-stabilized comparison achieved via the components 42 and 46 to 52 in FIG. 1. This avoids the more costly task (especially in view of the large peak-to-RMS factor of the IF input signal) of establishing an absolute RMS level for comparison purposes. The detectors 38, 54, and 56 are also themselves chopper-stabilized.

Figure 3:
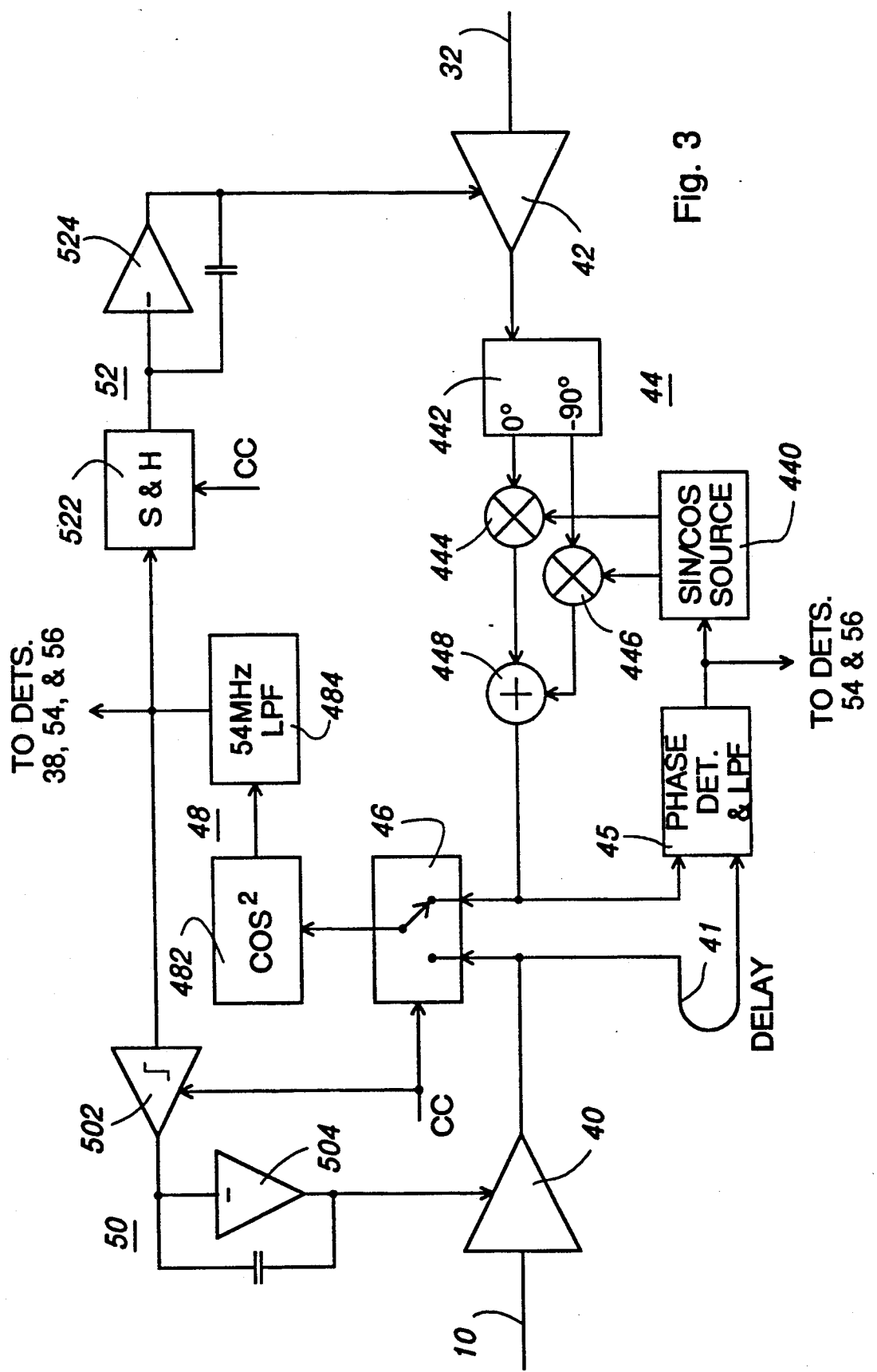
FIG. 3 is a block diagram illustrating in greater detail further parts of the transmitter of FIG. 1.

FIG. 3 illustrates the parts 40 to 52 of FIG. 1 in greater detail. As illustrated in FIG. 3, the phase detector and LPF circuit 45, comprising a RMS (root mean square) phase detector and a following low pass filter having a cut-off frequency greater than the symbol rate of the system, for example 54 MHz as shown, is coupled to the output of the amplifier 40 via a compensating delay line 41. The phase rotator 44 comprises a sin/cos source 440, a signal coupler 442 having phase quadrature outputs, multipliers 444 and 446, and an adder 448. The output of the circuit 45 drives the sin/cos source 440, whose outputs are multiplied with phase quadrature components of the IF output signal produced by the coupler 442 from the gain-adjusted output of the amplifier 42. The multiplication products are summed by the adder 448 to produce the output of the phase rotator 44. Although not shown in FIG. 3 for simplicity, the phase rotator 44 is chopper stabilized in known manner, for example using a 5 kHz square wave chopper control signal CC which is discussed further below.

The gain-adjusted IF input signal from the amplifier 40, and the gain-adjusted and phase resolved IF output signal from the phase rotator 44, are also supplied to the chopper-multiplexer circuit 46, which is represented in FIG. 3 by a selector switch controlled by the chopper control signal CC. Thus at the output of the circuit 46, the two IF signals are produced in a chopped and alternating manner, at the chopper rate of 5 kHz. The chopped, alternating signal is squared in a circuit 482, which has a $\cos^2$ characteristic, to recover baseband magnitude information, and the resulting signal is low pass filtered in a LPF 484, also having a cut-off frequency greater than the symbol rate, for example 54 MHz as shown. The circuits 482 and 484 together constitute the squaring and LPF circuit 48. The circuit 482 having a $\cos^2$ characteristic provides a simple demodulation of the IF signals, coherent in phase and amplitude with the modulation sidebands of the IF signals. This is much less costly than providing a carrier recovery type of demodulator, and being non-linear expands the signal peaks, making them easier to detect. The output of the LPF 484 is supplied to the peak AGC detector 50 and the RMS AGC control circuit 52 which are shown in FIG. 3, as well as to the detectors 38, 54, and 56.

The peak AGC detector 50 consists of a peak level comparator 502 and an integrator 504. The comparator 502 is controlled by the chopper control signal CC to compare the output of the LPF 484, at chopper times when the circuit 46 is switched to the output of the amplifier 40, with a threshold level to provide an output dependent upon peak levels of the IF input signal, and this output is integrated by the integrator 504 to provide an AGC control signal for the amplifier 40. The RMS AGC control circuit 52 comprises a sample-and-hold circuit 522 and an integrator 524. The sample-and-hold circuit 522 is controlled by the chopper control signal CC to sample the output of the LPF 484 at chopper times when the circuit 46 is switched alternately to its two inputs, and its output, representing any difference between the RMS levels of the IF input and output signals as supplied to the circuit 46, is integrated by the integrator 524 and used to control the gain of the amplifier 42 so that any RMS level difference is eliminated.

Figure 4:
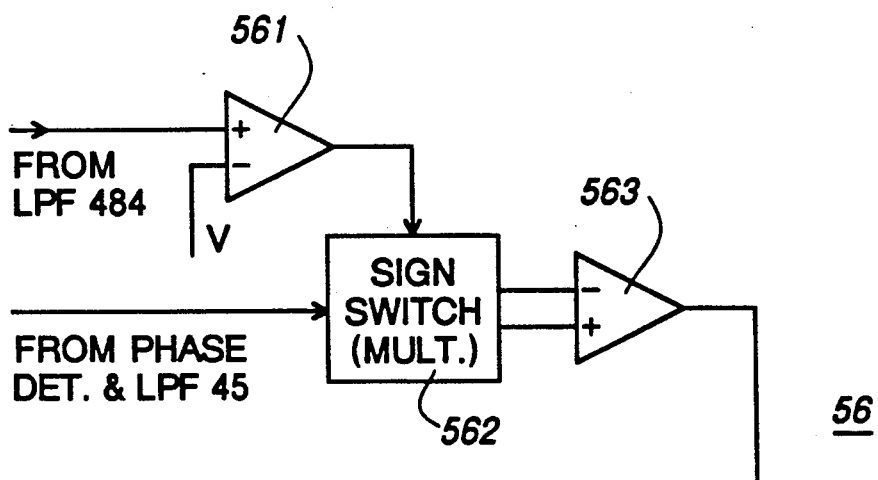
FIG. 4 illustrates in greater detail an AM/PM (amplitude modulation to phase modulation conversion) detector of the transmitter of FIG. 1.

FIG. 4 illustrates the AM/PM detector 56 in detail. This detector 56 comprises a differential amplifier 561 acting as a comparator, a sign switch 562 constituted by a multiplier, a differential amplifier 563, a switch 564 controlled in dependence upon the chopper control signal CC as represented by a broken line, resistors 565 and 566, a differential amplifier 567, and an integrating circuit 568 whose output constitutes the output of the AM/PM detector and is supplied to the store 57 as already described.

The output of the LPF 484 is connected to the non-inverting input, and a comparison voltage V is supplied to the inverting input, of the differential amplifier 561, whereby the amplifier 561 compares the amplitude of each symbol (as represented by either the IF input signal or the IF output signal, depending on the current chopper phase) with the comparison voltage V. The filtered phase detector output signal, constituted by the output of the phase detector and LPF circuit 45, is supplied to the sign switch 562, which is controlled, at the symbol rate of the system, by the output of the amplifier 561 to produce at its complementary outputs a signal corresponding to the filtered phase detector output signal either inverted or not depending upon whether the signal from the LPF 484 is less than or greater than, respectively, the comparison voltage V. The complementary outputs of the sign switch are connected to the differential inputs of the amplifier 563, which produces an output signal of a single polarity, which constitutes a phase distortion control signal.

To complete the chopper stabilization, this output signal of the amplifier 563 is switched by the switch 564 and via one of the resistors 565 and 566 to the inverting or non-inverting input, respectively, of the amplifier 567. The output of the amplifier 567 is therefore a chopper-stabilized phase distortion control signal. This control signal is integrated by the integrating circuit 568 to produce the output of the detector 56, which is stored in the store 57 to constitute the control signal Q as already described.

Figure 5:
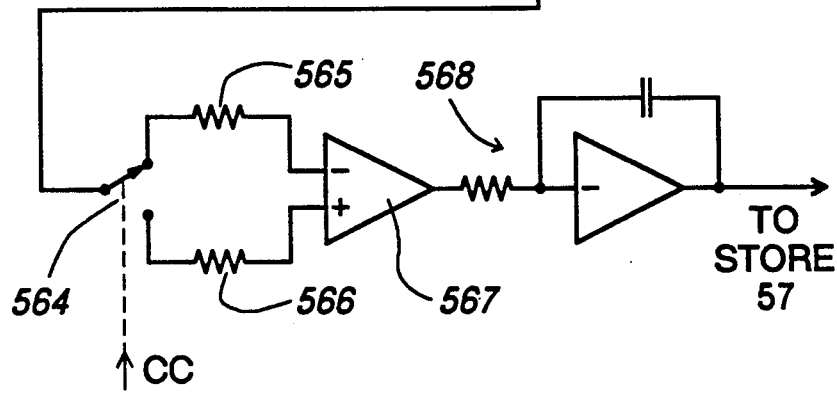
FIG. 5 is a QAM phase-plane diagram with reference to which the operation of the AM/PM detector is explained.
Figure 5:
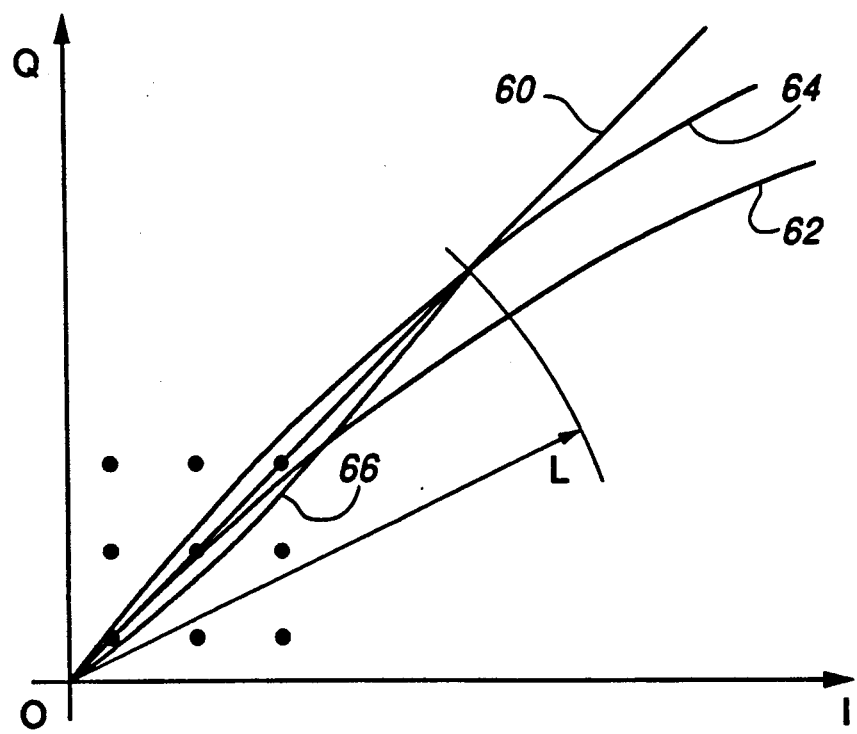

The operation of the AM/PM detector will be further understood with additional reference to FIG. 5, which is a phase-plane diagram illustrating amplitude modulation to phase modulation conversion distortion in a QAM system. FIG. 5 represents only the first quadrant of the phase plane diagram, for which the in-phase and quadrature-phase signal amplitudes (I and Q axes respectively) are positive. FIG. 5 also shows for simplicity only a few signal points near the origin O of the signal point constellation, it being well known that in a 512-QAM signal point constellation there are 512 signal points in the phase plane diagram, desirably arranged in a rectangular array within an approximately circular boundary, each signal point representing one symbol (combination of in-phase and quadrature-phase amplitudes) which can be communicated.

Considering for simplicity signal points with equal in-phase and quadrature-phase amplitudes, these ideally all lie on a line at an angle of 45° to the I and Q axes, i.e. a line 60 in FIG. 5. However, due to the non-linear phase characteristics of the power amplifier 22, these points tend to be distorted, or rotated in phase, so that they instead would lie on a line 62. For clarity the distortion or phase rotation is shown exaggerated in FIG. 5. As can be seen, for each signal point or symbol the phase rotation is non-linearly dependent upon amplitude (distance from the origin O), which is why this is referred to as AM/PM distortion.

It should be appreciated that this AM/PM distortion is particularly significant only when, to compensate for severe microwave fading conditions, the power amplifier 22 is operated at full power. As is well known, such severe fading conditions occur only rarely; the rest of the time the power amplifier 22 is conveniently switched to a much lower power output level at which its operational characteristics are relatively linear, so that AM/PM distortion is insignificant. It is for this reason that the store 57 is provided to store the control signals I and Q. Initially, the power amplifier 22 can be controlled manually to operate at full power to permit appropriate control signals I and Q to be determined by the detectors 54 and 56 and stored in the store 57. In subsequent normal operation, the stored control signals are only updated when the power amplifier 22 is operated at full power during severe microwave fading conditions, this being determined for example by the level control circuit 36 to enable updating of the store 57 coincident with full power operation of the power amplifier 22.

In the process of carrier recovery in operation of the communications system, the position of the line 62 (or, more precisely, the signal points along it) is approximated to its ideal position at the 45° angle of the line 60, so that it can be considered to take the position of a line 64, which is the same as the line 62 except for a phase rotation. As can be clearly seen from FIG. 5, relative to the ideal straight line 60, the line 64 has a phase rotation in one direction (anticlockwise as shown) for signal amplitudes less than a particular level represented as L in FIG. 5, and in the opposite direction (clockwise as shown) for signal amplitudes greater than this level L. The comparison voltage V supplied to the comparator 561 as described above is set to represent this level L.

Accordingly, for signal amplitudes less than L the output of the amplifier 561 is negative, so that the sign switch 562 is controlled to invert the filtered phase detector output signal from the circuit 45. This effectively replaces the line 64 up to the level L by a line 66. For signal amplitudes above the level L the output of the amplifier 561 is positive, so that the sign switch 562 is controlled to perform no inversion of the filtered phase detector output; thus for these signal amplitudes the line 64 still applies. It can be seen that the line 66 below the level L and the line 64 above the level L both have the same direction of phase rotation from the ideal line 60 in FIG. 5. Consequently, the phase rotation which takes place in the process of carrier recovery as described above serves to rotate the combined line 64 (above L) and 66 to a position more accurately corresponding to the ideal line 60, whereby the AM/PM distortion is reduced.

The differential amplifier 563 sums the output of the sign switch 562, so that the phase distortion control signal produced at the output of this amplifier, and consequently the chopper-stabilized and integrated phase distortion control signal produced at the output of the integrating circuit 568, represents the average phase difference or phase rotation between the lines 66 and 64 (above the level L) and the ideal line 60. This resulting signal is a measure of the phase distortion which is produced by the power amplifier 22 due to the non-linear phase characteristics of the power amplifier.

Accordingly, these non-linear phase characteristics are adaptively compensated for by supplying the output of the integrating circuit 568, i.e. the output of the AM/PM detector 56, via the store 57 to the predistorter 14 as the control signal Q, thereby to produce a compensating phase rotation of the average of the lines 66 and 64 (above the level L) towards the ideal line 60.

Although the above description relates only to the signal points of the signal point constellation which have equal in-phase and quadrature-phase amplitudes, the principles described above apply equally and continuously for all of the signal points.

Numerous modifications, variations, and adaptations may be made to the described embodiment of the invention without departing from the scope of the invention as defined in the claims. For example, although as described above the operation of the chopper-multiplexer circuit 46 results in the amplifier 561 comparing amplitudes of the IF input and IF output signals, alternately at the chopper rate, with the comparison voltage V, instead the comparison for each signal point or symbol could always be between the comparison voltage V and a selected one of the IF input and IF output signals.

What is claimed is:

1. A method of adaptively controlling a predistorter to compensate for phase distortion in a power amplifier of an RF(radio frequency) communications system in which an IF(intermediate frequency) input signal is mixed with a local oscillator signal to produce an RF signal for transmission, comprising the steps of:
   deriving from the local oscillator signal and the RF signal an IF output signal representative of the output power of the power amplifier;
   detecting phase differences between the IF input and IF output signals to produce a phase difference signal;
   comparing an amplitude of at least one of the IF input and IF output signals with a comparison level;
   selectively inverting the phase difference signal in dependence upon a result of the comparison; and
   integrating the selectively inverted phase difference signal to produce a phase control signal for the predistorter.

2. A method as claimed in claim 1 and including the step of storing the phase control signal.

3. A method as claimed in claim 1 and including the steps of chopping the IF input and IF output signals, alternately squaring the chopped signals to remove phase information, and alternately comparing the chopped and squared signals with the comparison level to control the selective inversion of the phase difference signal.

4. A method as claimed in claim 3 and including the step of storing the phase control signal.

5. A transmitter for an RF(radio frequency) communications system, comprising:
   means for amplifying an IF(intermediate frequency) input signal;
   a predistorter for predistoring the IF signal;
   a first mixer for mixing a local oscillator signal with the amplified and predistorted IF signal to produce an RF signal;
   a power amplifier for amplifying the RF signal for transmission;
   a second mixer for mixing the local oscillator signal with a part of the amplified RF signal to produce an IF output signal;
   means responsive to the IF input signal and to the IF output signal for producing a phase difference signal representing phase differences between the IF input signal and the IF output signal;

means for comparing an amplitude of at least one of the IF input and IF output signals with a predetermined comparison level;

means for selectively inverting the phase difference signal in dependence upon a result of the comparison;

means for integrating the selectively inverted phase difference signal to produce a phase control signal; and means for controlling the predistorter with the phase control signal.

6. A transmitter as claimed in claim 5 wherein the means for controlling the predistorter comprises means for storing the phase control signal.

7. A transmitter as claimed in claim 5 wherein the means for selectively inverting the phase difference signal comprises means for chopping the IF input and IF output signals, means for alternately squaring the chopped signals to remove phase information, and means for alternately comparing the chopped and squared signals with the comparison level to control the selective inversion of the phase difference signal.

8. A transmitter as claimed in claim 7 wherein the means for controlling the predistorter comprises means for storing the phase control signal.

* * * * *